United States Patent
Shih

(10) Patent No.: US 11,133,251 B1
(45) Date of Patent: Sep. 28, 2021

(54) SEMICONDUCTOR ASSEMBLY HAVING T-SHAPED INTERCONNECTION AND METHOD OF MANUFACTURING THE SAME

(71) Applicant: NANYA TECHNOLOGY CORPORATION, New Taipei (TW)

(72) Inventor: Shing-Yih Shih, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 16/819,758

(22) Filed: Mar. 16, 2020

(51) Int. Cl.
*H01L 23/528* (2006.01)
*H01L 23/538* (2006.01)
*H01L 23/28* (2006.01)

(52) U.S. Cl.
CPC ............ *H01L 23/528* (2013.01); *H01L 23/28* (2013.01); *H01L 23/538* (2013.01)

(58) Field of Classification Search
CPC ..... H01L 23/258; H01L 23/28; H01L 23/538; H01L 21/76897; H01L 21/76898; H01L 2225/06541; H01L 2225/06548; H01L 2224/16145; H01L 2224/16146
See application file for complete search history.

(56) References Cited

U.S. PATENT DOCUMENTS

| | | |
|---|---|---|
| 6,100,195 A | 8/2000 | Chan et al. |
| 2012/0074584 A1 | 3/2012 | Lee et al. |
| 2013/0270713 A1* | 10/2013 | Liao ...................... H01L 23/481 257/774 |
| 2013/0292849 A1 | 11/2013 | Lin et al. |
| 2015/0069619 A1* | 3/2015 | Chou .................. H01L 25/0657 257/774 |
| 2020/0075460 A1* | 3/2020 | Hu ........................ H01L 23/481 |

FOREIGN PATENT DOCUMENTS

| | | |
|---|---|---|
| JP | 5947092 B2 | 7/2016 |
| TW | 201724192 A | 7/2017 |
| TW | 201919175 A | 5/2019 |

OTHER PUBLICATIONS

Office Action issued in corresponding TW application No. 110103830 dated May 31, 2021 (12 pages).

* cited by examiner

*Primary Examiner* — Peniel M Gumedzoe
(74) *Attorney, Agent, or Firm* — Muncy, Geissler, Olds & Lowe, P.C.

(57) ABSTRACT

The present disclosure provides a semiconductor assembly and method of manufacturing the same. The semiconductor assembly includes a semiconductor device, a bulk semiconductor, a passivation layer, at least one conductive plug, a plurality of protective liners, and a plurality of isolation liners. The bulk semiconductor is disposed over the semiconductor device. The passivation layer covers the bulk semiconductor. The conductive plug comprises a first block disposed in the passivation layer and a second block disposed between the first block and the conductive pad, wherein portions of peripheries of the first and second blocks of the conductive plug are surrounded by the protective liners and the isolation liners.

12 Claims, 20 Drawing Sheets

SEMICONDUCTOR ASSEMBLY HAVING T-SHAPED INTERCONNECTION AND METHOD OF MANUFACTURING THE SAME

TECHNICAL FIELD

The present disclosure relates to a semiconductor assembly and a method of manufacturing the same, and more particularly to a semiconductor assembly having T-shaped interconnection and a method of manufacturing the same.

DISCUSSION OF THE BACKGROUND

Since the invention of integrated circuits, the semiconductor industry has experienced continuous rapid growth due to constant improvement in the integration density of various electronic components (i.e., transistors, diodes, resistors, capacitors, etc.). For the most part, this improvement in integration density has come from repeated reductions in minimum feature size, allowing more components to be integrated into a given chip area.

These integration improvements are essentially two-dimensional (2D) in nature, in that the volume occupied by the integrated components is essentially on the surface of the semiconductor wafer. Dramatic improvements in lithography have resulted in considerable improvements in 2D integrated circuit formation. However, due to the reduced size of the component, the contact area between conductive pads of the integrated components and bumps is decreased, such that delamination of the bumps and the conductive pad may easily occur, thereby adversely affecting the electrical performance and reliability of the semiconductor device.

This Discussion of the Background section is provided for background information only. The statements in this Discussion of the Background are not an admission that the subject matter disclosed in this Discussion of the Background section constitute prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor assembly. The semiconductor assembly includes a semiconductor device, a bulk semiconductor, a passivation layer, at least one conductive plug, a plurality of protective liners, and a plurality of isolation liners. The semiconductor device includes at least one conductive pad. The semiconductor wafer is disposed over the semiconductor device. The passivation layer covers the semiconductor wafer. The conductive plug includes a first block disposed in the passivation layer and a second block disposed between the first block and the conductive pad. Portions of peripheries of the first and second blocks of the conductive plug are surrounded by the plurality of protective liners. The plurality of isolation liners are disposed over portions of the peripheries of the first and second blocks of the conductive plug.

In some embodiments, the first block has a first width, and the second block has a second width less than the first width.

In some embodiments, the first and second blocks are symmetric with respect to a central axis C.

In some embodiments, the conductive plug is surrounded by a diffusion barrier film.

In some embodiments, the semiconductor assembly further includes a dielectric layer disposed between the semiconductor device and the bulk semiconductor.

In some embodiments, at least one of the isolation liners includes a vertical segment attached to the protective liners and a horizontal segment connecting lower ends of the vertical segment to the conductive plug.

In some embodiments, the protective liners are interposed between the vertical segments of the isolation liners and the conductive plug.

In some embodiments, the protective liners and the isolation liners separate the conductive material from the bulk semiconductor.

In some embodiments, wherein the protective liners and the isolation liners are not in contact with the conductive pad.

Another aspect of the present disclosure provides a method of manufacturing a semiconductor assembly. The semiconductor assembly includes steps of bonding a bulk semiconductor to a semiconductor device via a dielectric layer; depositing a passivation layer on the bulk semiconductor; creating at least one recess in the passivation layer; creating at least one trench penetrating through the passivation layer and the bulk semiconductor and extending into the dielectric layer, wherein the trench is in communication with the recess; forming a plurality of isolation liners and a plurality of protective liners on inner walls of the bulk semiconductor, the dielectric layer and the portion of the passivation layer exposed by the recess and the trench; removing a portion of the dielectric layer below the trench to expose at least one conductive pad of the semiconductor device; and depositing a conductive material in the trench and the recess until the trench and the recess are filled.

In some embodiments, the method further includes a step of depositing a diffusion barrier film on the conductive pad, the isolation liners, the protective liners, and portions of the dielectric layer and the passivation layer exposed through the protective liners prior to the deposition of the conductive material.

In some embodiments, the diffusion barrier film has a topology following the topology of the isolation liners, the protective liners, the portions of the passivation layer exposed by the recess, and the portions of the dielectric layer not covered by the isolation liners and the protective liners.

In some embodiments, the formation of the isolation liners and the protective liners includes steps of depositing an isolation film on the passivation layer and in the recess and the trench; depositing a protective film on the isolation film; removing horizontal portions of the protective film to form the protective liners; and removing portions of the isolation film not covered by the protective liners.

In some embodiments, portions of the passivation layer not covered by the isolation liners are removed during the removal of the portion of the portion of the dielectric layer below the trench.

In some embodiments, the portion of the dielectric layer below the trench is removed during the removal of the portion of the isolation film not cover by the diffusion barrier liners.

In some embodiments, the isolation film has a topology following the topology of the bulk semiconductor, the dielectric layer, and the portions of the passivation layer exposed by the recess and the trench.

In some embodiments, the bonding of the bulk semiconductor and the semiconductor device includes steps of depositing dielectric films on the semiconductor device and the bulk semiconductor; mounting the semiconductor device on the bulk semiconductor so that the dielectric films are in contact; and performing an anneal process to fuse the dielectric films, thereby forming the dielectric layer.

In some embodiments, after the formation of the trench, a thickness of the dielectric layer below the trench is less than half of a thickness of the dielectric layer connecting the bulk semiconductor to the semiconductor device.

In some embodiments, the conductive pad has a first width, the recess has a second width less than the first width, and the trench has a third width less than the first and second widths.

In some embodiments, the method further includes a step of performing a grinding process to thin the bulk semiconductor prior to the deposition of the passivation layer.

In some embodiments, the method further includes steps of performing a planarizing process to remove a portion of the conductive material overflowing the recess; and forming at least one bump on the conductive material after the planarizing process.

With the above-mentioned configurations of the semiconductor assembly, the footprint of the conductive plug exposed through the passivation layer is increased, thereby reducing the difficulty of bonding a bump on the conductive plug.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be coupled to the figures' reference numbers, which refer to similar elements throughout the description.

DETAILED DESCRIPTION

Figure 1:
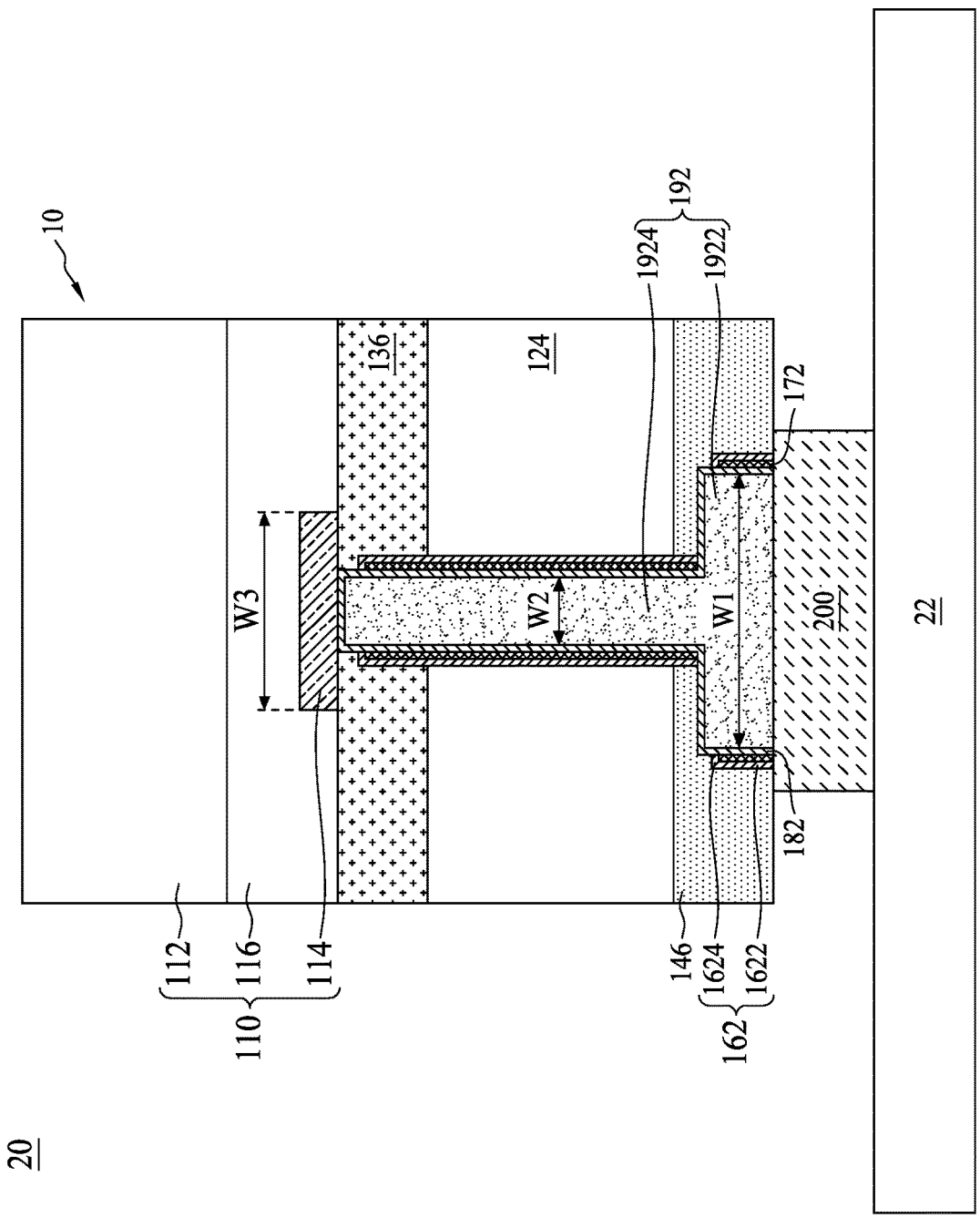
FIG. 1 is a cross-sectional view of an electronic system in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limiting to the present inventive concept. As used herein, the singular forms "a," "an" and "the" are intended to include the plural forms as well, unless the context clearly indicates otherwise. It shall be understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1 is a cross-sectional view of an electronic system 20 in accordance with some embodiments of the present disclosure. Referring to FIG. 1, the electronic system 20 includes a semiconductor assembly 10 and an external device 22 electrically coupled to the semiconductor assembly 10 The semiconductor assembly 10 includes a semiconductor device 110, a bulk semiconductor 124 bonded to the semiconductor device 110 via a dielectric layer 136, a passivation layer 146 covering the bulk semiconductor 124, and at least one conductive plug 192 penetrating through the dielectric layer 136, the bulk semiconductor 124 and the passivation layer 146, wherein the conductive plug 192 contacts at least one conductive pad 114 of the semiconductor device 110. The semiconductor device 110 further includes a substrate 112 and an insulative layer 116 covering the substrate 112, wherein the conductive pad 114 is surrounded by the insulating layer 116.

The conductive plug 192 includes a first block 1922 disposed in the passivation layer 146 and a second block 1924 penetrating through the bulk semiconductor 124 and the dielectric layer 136, wherein the second block 1924 is connected to the first block 1922 in the passivation layer 146. In other words, the second block 1924 is disposed between the first block 1922 and the conductive pad 114. The first block 1922 and the second block 1924 of the conductive plug 192 can be integrally formed. The first block 1922 of the conductive plug 192 has a width W1, the second block 1924 of the conductive plug 192 has a width W2 less than the width W1. The conductive pad 114 of the semiconductor device 110 has a width W3 less than the width W1. In some embodiments, the second block 1924 of the conductive plug 192 has the width W2 less than the width W3 to reduce the manifesting cost. In some embodiments, the conductive plug 192 includes aluminum or aluminum alloys. In alternative embodiments, the conductive plug 192 can include copper or copper alloys, which have lower resistance than aluminum.

The semiconductor assembly 10 further includes a plurality of isolation liners 162, and a plurality of protective liners 172 disposed over portions of peripheries of the first and second blocks 1922 and 1924 of the conductive plug 192. The isolation liners 162 and the protective liners 172, penetrating through the bulk semiconductor 124 and extending into the dielectric layer 136. The isolation liners 162 and the protective liners 172 are not in contact with the conductive pad 114. The isolation liners 162 and the protective lines 172 can separate the conductive plug 192 from the bulk semiconductor 124, thereby preventing the metal containing in the conductive plug 192 from diffusing into the bulk semiconductor 124.

The isolation liners 162 include a plurality of vertical segments 1622 surrounding the protective liners 172 and a plurality of horizontal segments 1624 connecting lower ends of the vertical segments 1622 to the conductive plug 192. The protective liners 172 are interposed between the vertical segments 1622 of the isolation liners 162 and the conductive plug 192. The vertical and horizontal segments 1622 and 1624 of the isolation liners 162 have a substantially uniform thickness. In addition, the vertical and horizontal segments 1622 and 1624 of the isolation liners 162 are integrally formed. The dielectric layer 136, the passivation layer 146 and the isolation liners 162 can be formed using the same material, but the present disclosure is not limited thereto. By way of example, the dielectric layer 136, the passivation layer 146 and the isolation liners 162 include oxide-based material. The protective lines 172, having a substantially uniform thickness, can include refractory metals (such as tantalum and titanium).

The semiconductor assembly 10 can further include a diffusion barrier film 182 disposed between the protective liners 172 and the conductive plug 192, between the conductive pad 114 and the second block 1924 of the conductive plug 192, between the dielectric layer 136 and the second block 1924 of the conductive plug 192, and between the passivation layer 146 and the first block 1922 of the conductive plug 192. In other words, the conductive plug 192 is surrounded by the diffusion barrier film 182 having a substantially uniform thickness. The diffusion barrier film 182 includes refractory metals. In some embodiments, the diffusion barrier film 182 is function as an adhesive layer to prevent the conductive plug 192 from flaking or spalling from the dielectric layer 136 and the passivation layer 146. In some embodiments, the protective liners 172 and the diffusion barrier film 182 can include the same refractory metal. By way of example, the protective liners 172 can be made of titanium, and the diffusion barrier film 182 can be made of titanium nitride.

The semiconductor assembly 10 can also include a bump 200 physically and electrically connected to the diffusion barrier film 182 and the first block 1922 of the conductive plug 192. In the present disclosure, the first block 1922 of the conductive plug 192 having the width W1 greater than that of the conductive pad 114 of the semiconductor device 110 may increase the contact area and adhesion strength between the conductive plug 192 and the bump 200, such that the detachment or delamination of the bump 200 may be prevented.

The diffusion barrier film 182 and the conductive plug 192 serve as an electrical interconnection between the conductive pad 114 and the bumps 200. The bumps 200 serve as input/output (I/O) connections to electrically connect the semiconductor assembly 10 to the external device 22 including a central processing unit (CPU), a graphics processing unit (GPU). In some embodiments, the bump 200 is in contact with the vertical portion 1622 of the isolation liner 162 and the protective liner 172 over the first block 1922 of the conductive plug 192. In some embodiments, the bump 200 may cover a portion of the passivation layer 146.

Figure 2:
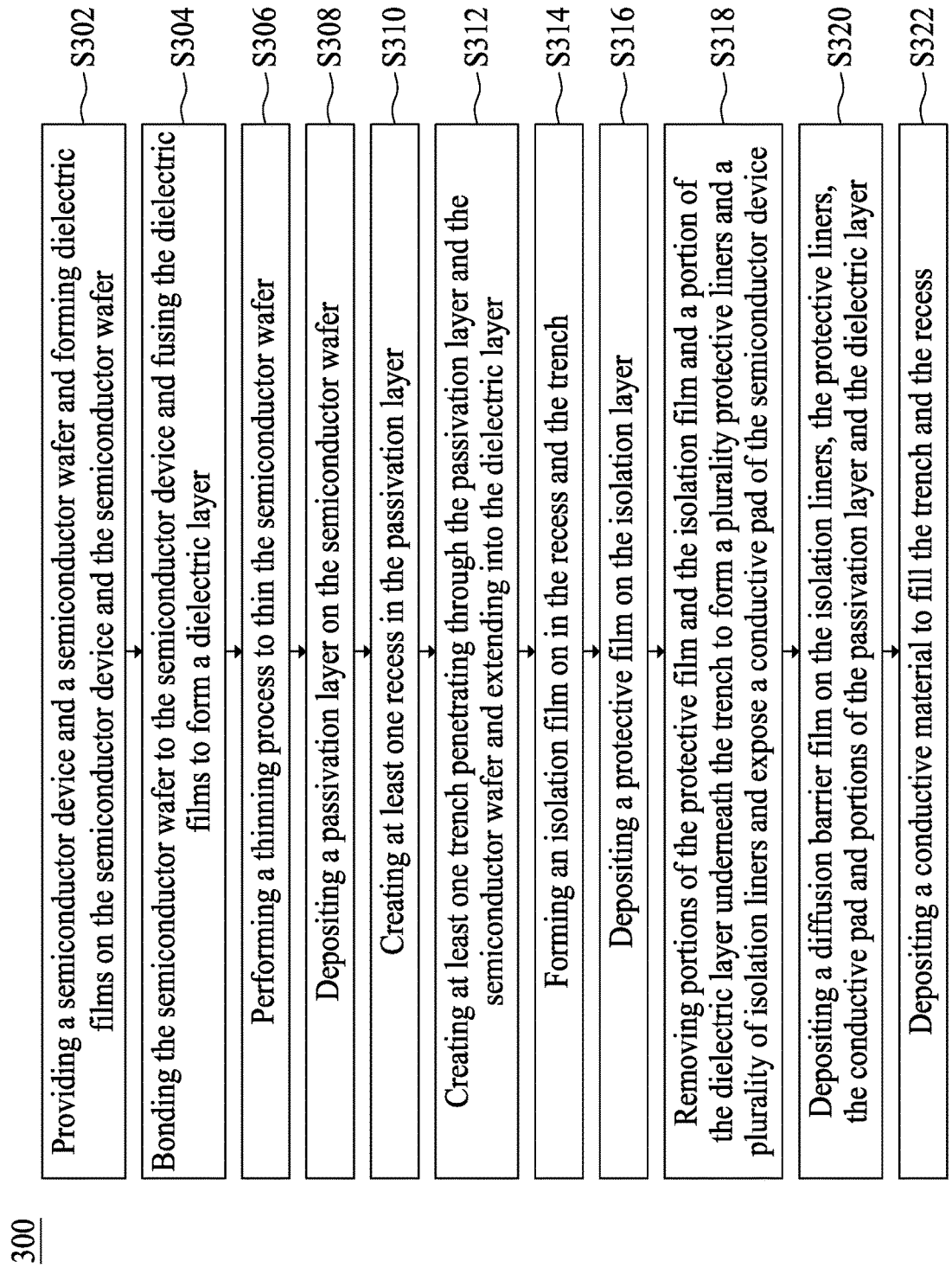
FIG. 2 is a flow diagram illustrating a method of manufacturing a semiconductor assembly in accordance with some embodiments of the present disclosure.

FIG. 2 is a flow diagram illustrating a method 300 of manufacturing a semiconductor assembly 10 in accordance with some embodiments of the present disclosure, and FIGS. 3 through 20 illustrate cross-sectional views of intermediate stages in the formation of the semiconductor assembly 10 in accordance with some embodiments of the present disclosure. The stages shown in FIGS. 3 to 20 are also illustrated schematically in the flow diagram in FIG. 2. In the following discussion, the fabrication stages shown in FIGS. 3 to 20 are discussed in reference to the process steps shown in FIG. 2.

Figure 3:
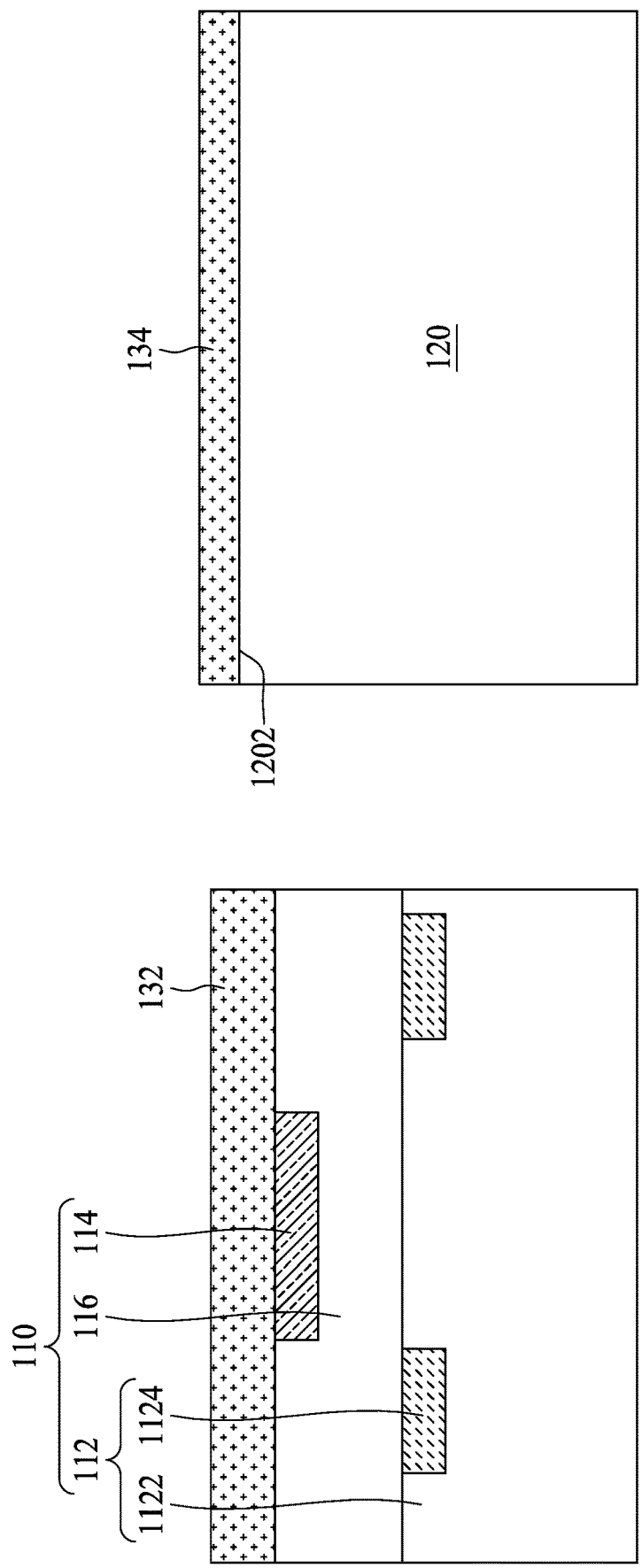
FIGS. 3 through 20 illustrate cross-sectional views of intermediate stages in the formation of a semiconductor assembly in accordance with some embodiments of the present disclosure.

Referring to FIG. 3, a semiconductor device 110 and a bulk semiconductor 120 are provided and dielectric films 132 and 134 are formed on the semiconductor device 110 and the bulk semiconductor 120, respectively, according to a step S302 in FIG. 3. The dielectric film 132 is disposed to cover at least one conductive pad 114 disposed over a substrate 112 and surrounded by an insulative layer 116 of the semiconductor device 110.

The substrate 112 of the semiconductor device 110 can include a semiconductor wafer 1122 and one or more main components 1124 disposed in or on the semiconductor wafer 1122. The semiconductor wafer 1122 and the bulk semiconductor 120 can be made of silicon. Alternatively or additionally, the semiconductor wafer 1122 and bulk semiconductor 120 may include other elementary semiconductor materials such as germanium. In some embodiments, the semiconductor wafer 1122 and bulk semiconductor 120 are made of a compound semiconductor such as silicon carbide, gallium arsenic, indium arsenide, or indium phosphide. In some embodiments, the semiconductor wafer 1122 and bulk semiconductor 120 are made of an alloy semiconductor such as silicon germanium, silicon germanium carbide, gallium arsenic phosphide, or gallium indium phosphide. In some embodiments, the semiconductor wafer 1122 can include an epitaxial layer. For example, the semiconductor wafer 1122 has an epitaxial layer overlying a bulk semiconductor.

The semiconductor wafer 1122 may be formed with various doped regions (not shown) doped with p-type dopants, such as boron, and/or n-type dopants, such as phosphorus or arsenic. In some embodiments, isolation features (not shown), such as shallow trench isolation (STI) features or local oxidation of silicon (LOCOS) features, can be introduced in the semiconductor wafer 1122 to define and isolate various main components 1124 in the semiconductor wafer 1122. The main components 1124 can be electrically connected to the conductive pad 114 through conductive features (not shown) buried in the insulative layer 116 and formed using the well-known damascene processes. The main components 1124 may include active components, such as transistors and/or diodes, and passive components, such as capacitors, resistors or the like. The main components 1124 are formed using various processes including deposition, etching, implantation, photolithography, annealing, and/or other applicable processes. In addition, the main components 1124 may interconnect with one another (via the conductive pad 114 and the conductive features) to form, for example, a logic device, a memory device, an input/output device, a system-on-chip device, another suitable type of device, or a combination thereof. In some embodiments, the main components 1124 may be formed in the semiconductor wafer 1122 during front-end-of-line (FEOL) processes. The conductive pad 114 and the insulative layer 116 may be formed over the semiconductor wafer 1122 during back-end-of-line (BEOL) process.

The dielectric film 132 fully covers the conductive pad 114 and the insulative layer 116. The dielectric film 132 is formed by depositing a dielectric material, including oxide-based material, on the semiconductor device 110 using a chemical vapor deposition (CVD) process, for example. The dielectric film 134 is formed on the entire front surface 1202 of the bulk semiconductor 120. The dielectric film 134, including oxide-based material, can be a deposition layer formed using a CVD process or an oxidized layer formed using a thermal oxidation process, wherein the thermally-grown oxides can include a higher level of purity than the deposited oxides.

Figure 4:
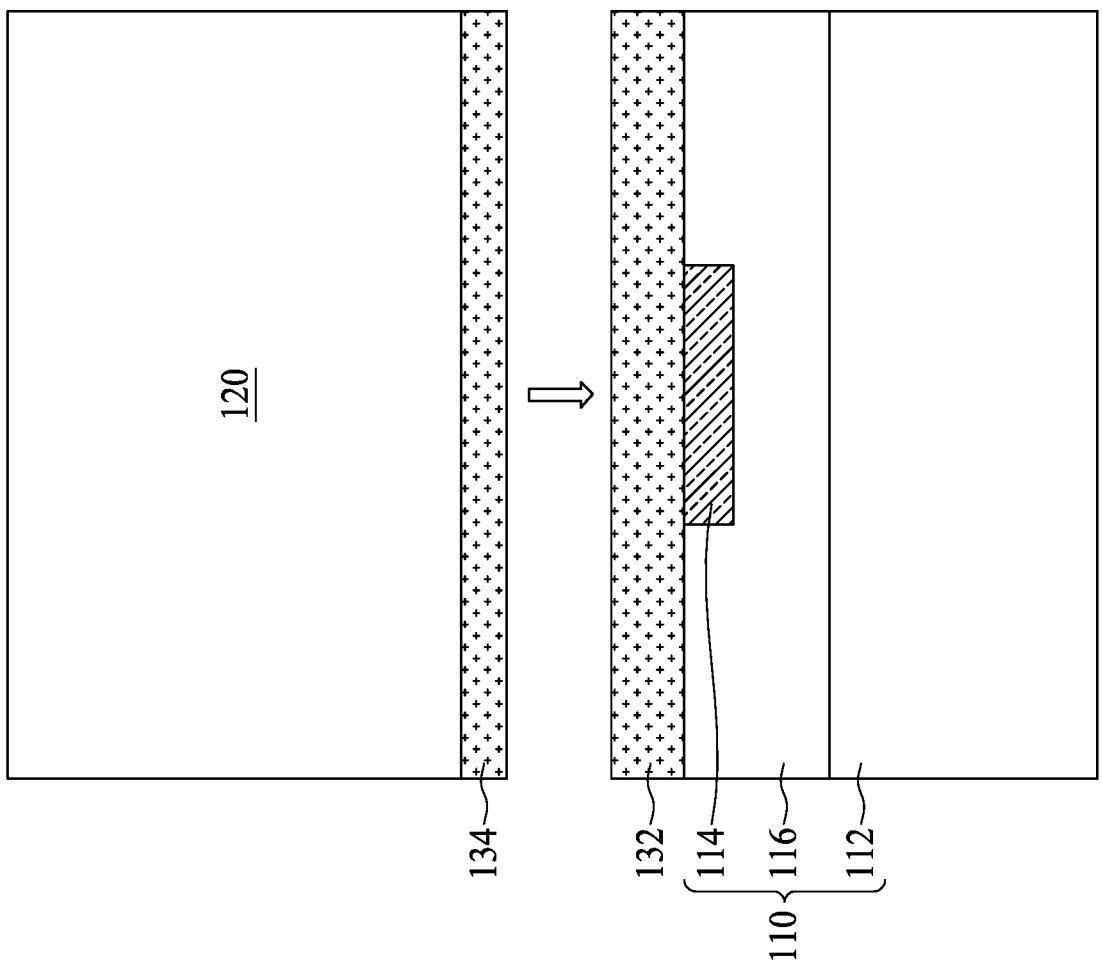

Referring to FIG. 4, the bulk semiconductor 120 is flipped upside down, such that the dielectric films 132 and 134 can face and be aligned with one another. In some embodiments, planarizing processes can be optionally performed on the dielectric films 132 and 134 prior to the alignment of the semiconductor device 110 and the bulk semiconductor 120 to yield an acceptably flat topology.

Figure 5:
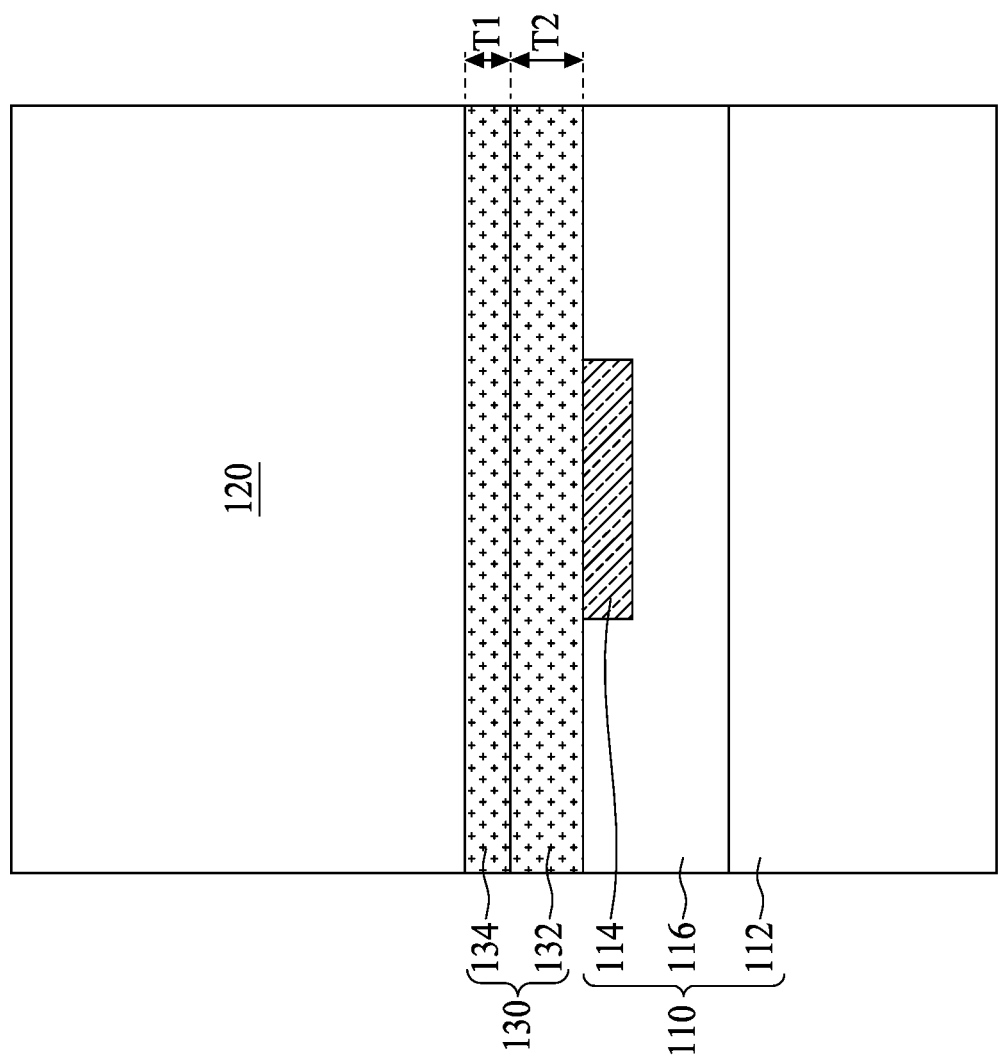

Referring to FIG. 5, the bulk semiconductor 120 is bonded to the semiconductor device 110 according to a step S304 in FIG. 2. After the bonding of the semiconductor device 110 to the bulk semiconductor 120, the dielectric film 132 on the semiconductor device 110 is in direct contact with the dielectric film 134 on the bulk semiconductor 120. After surfaces of the dielectric films 132 and 134 are brought into contact, heat and force are applied to fuse the dielectric films 132 and 134, thus forming a dielectric layer 130. In some embodiments, the strength of the fusion bonding between the dielectric films 132 and 134 may be increased by exposing the semiconductor device 110 and the bulk semiconductor 120 coated with the dielectric films 132 and 134, respectively, to an anneal process.

In addition, the dielectric film 134 coated on the bulk semiconductor 120 has a first thickness T1, and the dielectric film 132 covering the semiconductor device 110 has a second thickness T2 greater than the first thickness T1, thereby mitigating stress applied to the semiconductor device 110 during the fusing of the dielectric films 132 and 134.

Figure 6:
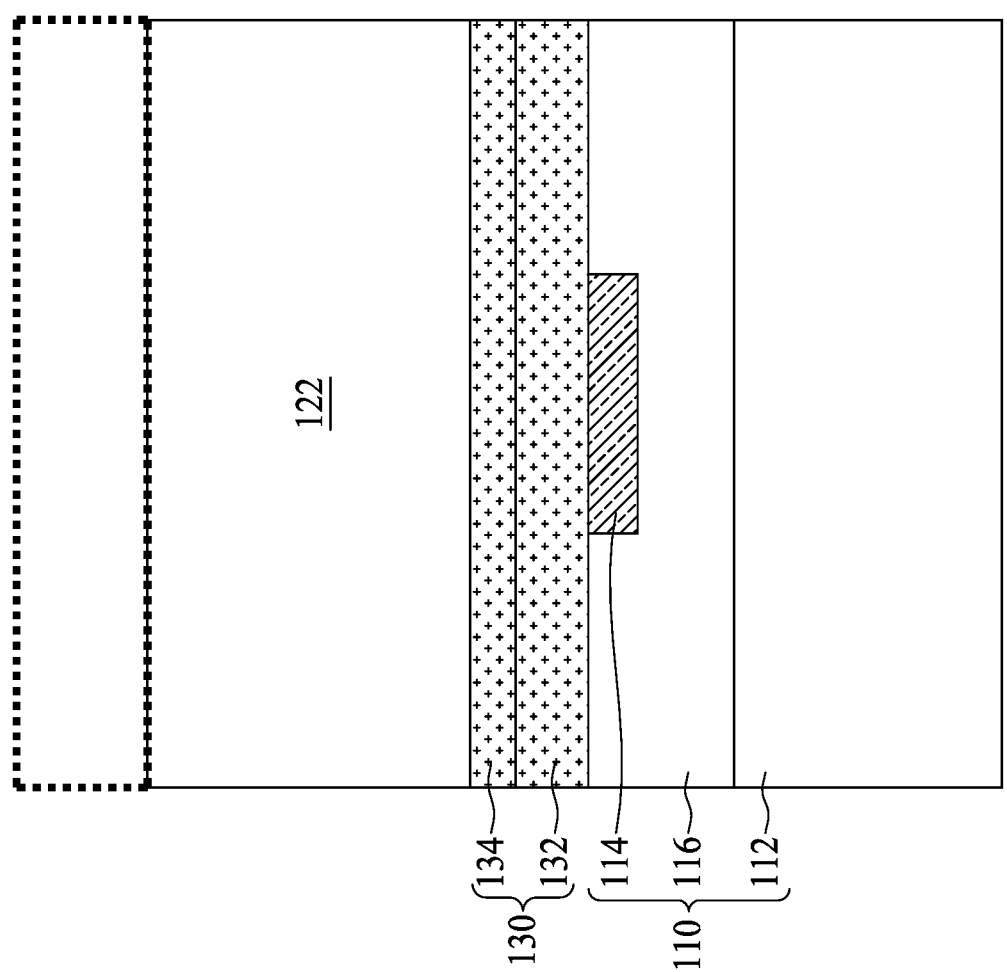

Referring to FIGS. 5 and 6, a thinning process is performed on the bulk semiconductor 120 to decrease a thickness thereof according to a step S306 in FIG. 2. The bulk semiconductor 120 shown in FIG. 5 is thinned to reduce processing time for forming at least one conductive plug, as described below. In FIG. 6, the dotted line on the thinned bulk semiconductor 122 indicates an original thickness of the bulk semiconductor 120. The thinning process can be implemented using suitable techniques such as grinding, polishing and/or chemical etching.

Figure 7:
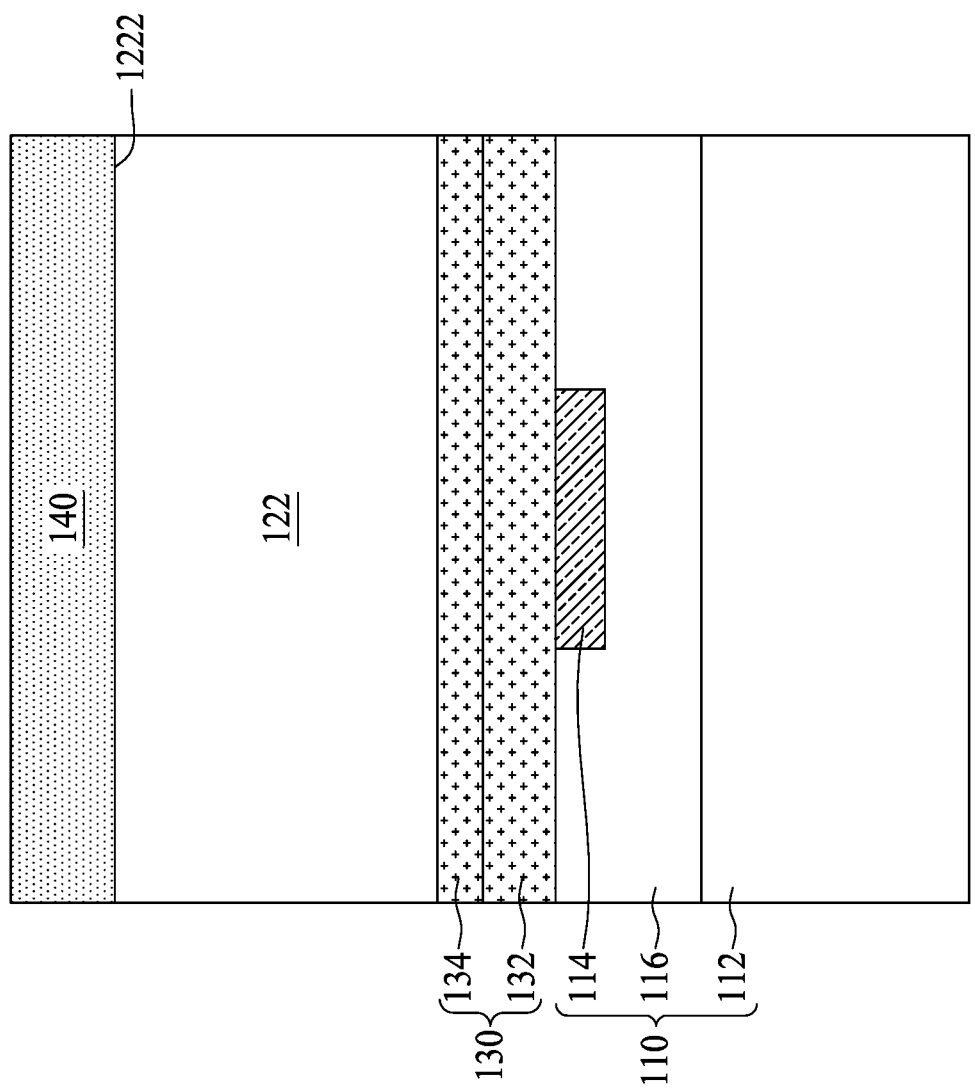

Referring to FIG. 7, a passivation layer 140 is deposited on the thinned bulk semiconductor 122 according to a step S308 in FIG. 2. The passivation layer 140 can be formed by depositing a dielectric material on a surface 1222 of the thinned bulk semiconductor 122. The passivation layer 140, including silicon-containing materials such as silicon dioxide or silicon nitride, may be formed using a spin-coating process, a CVD process, or another suitable process that can form a dielectric material. In some embodiments, a planarizing process can be optionally performed after the deposition of the dielectric material to yield an acceptably flat topology. In some embodiments, the passivation layer 140 can have a uniform thickness.

Figure 8:
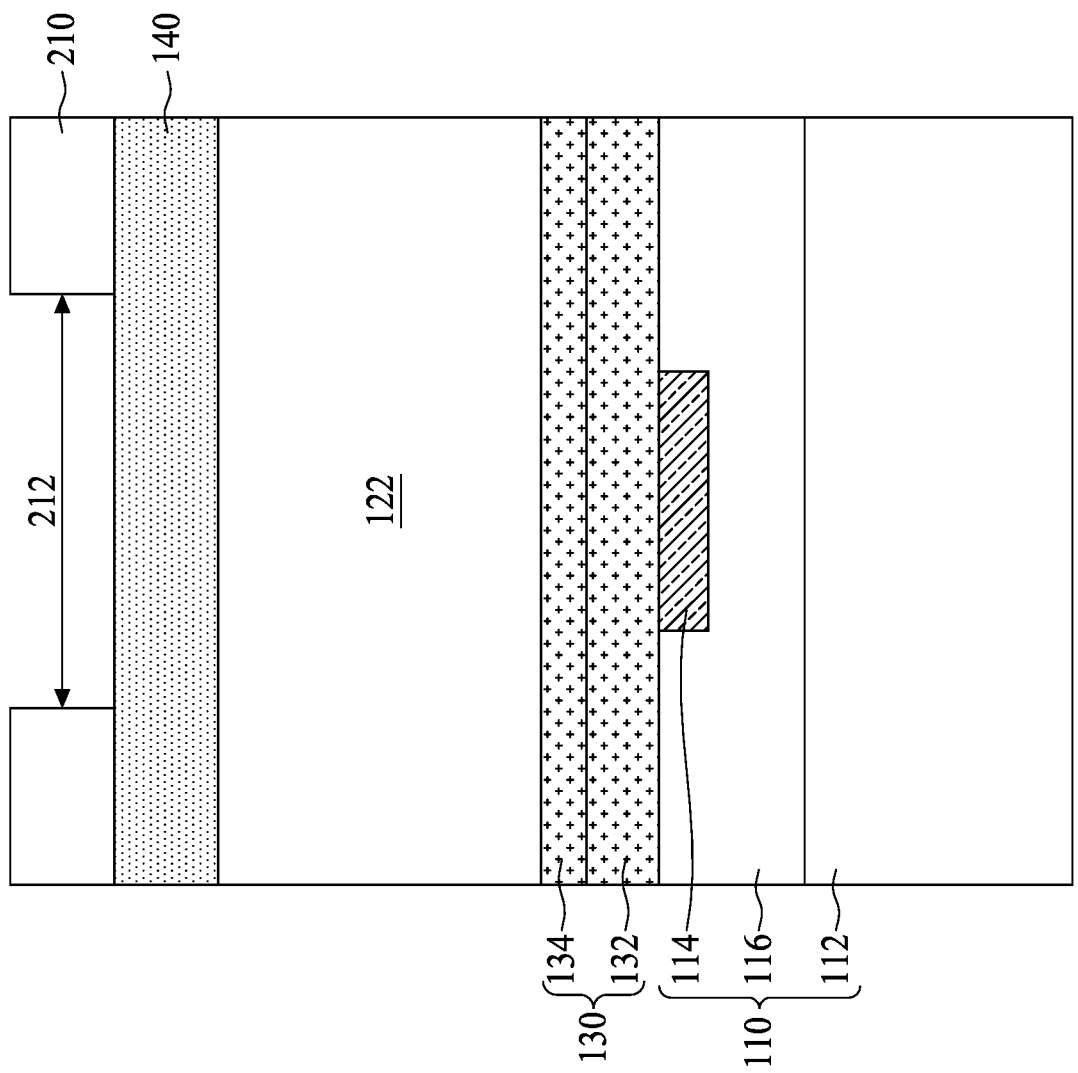

Referring to FIG. 8, a first photoresist mask 210, including at least one opening 212, is provided on the passivation layer 140. The first photoresist mask 210 is formed by steps including (1) conformally coating a photosensitive material on the passivation layer 140, (2) exposing portions of the photosensitive material to radiation (not shown), (3) performing a post-exposure baking process, and (4) developing the photosensitive material, thereby forming the opening 212 to expose a portion of the passivation layer 140. The portion of the passivation layer 140 over the conductive pad 114 is exposed through the first photoresist mask 210.

Figure 9:
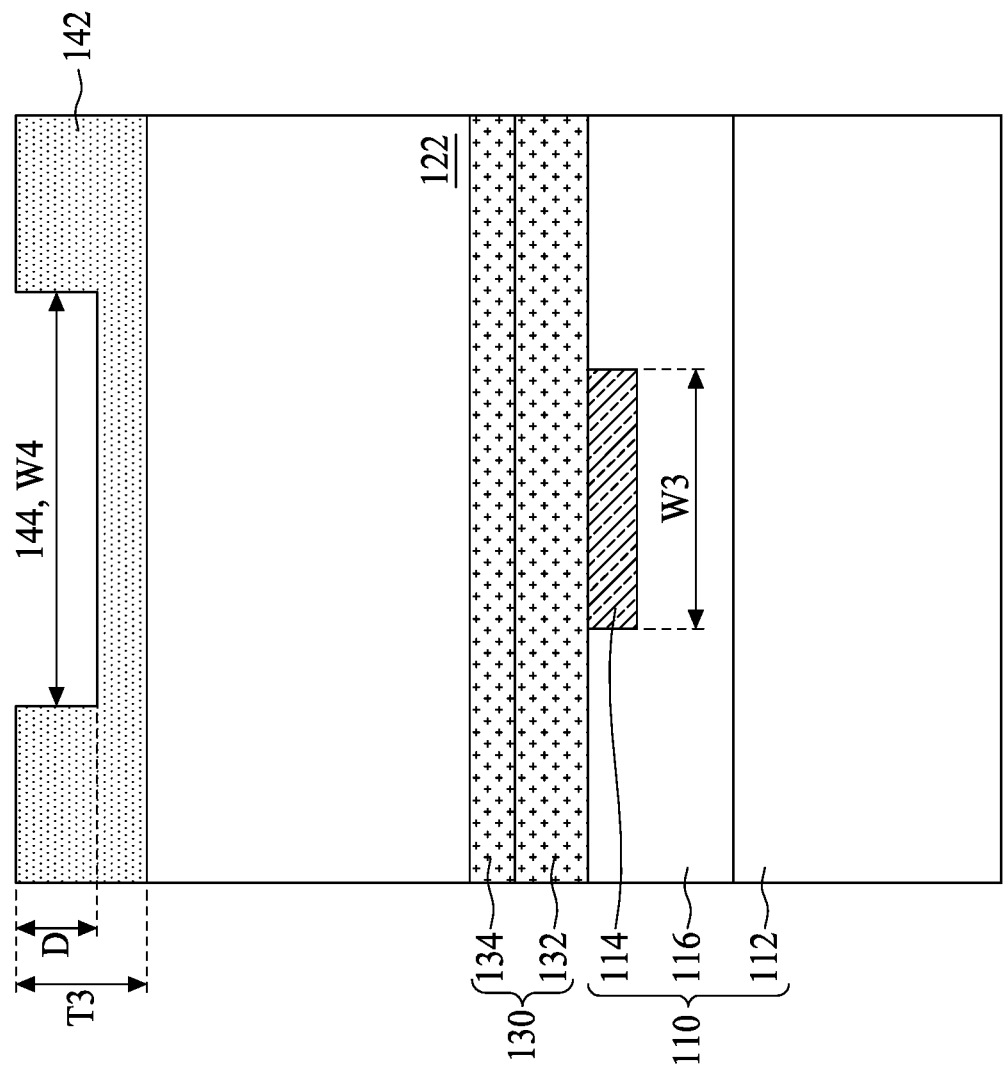

Referring to FIGS. 8 and 9, a recess 144 is created in the passivation layer 140 according to a step S310 in FIG. 2. The recess 144 is formed by removing a portion of the passivation layer 140 not covered by the photoresist mask 210. The portion of the passivation layer 140 is removed using a dry etching process, an anisotropic wet etching process, or any other suitable anisotropic process, so that the width of the opening 212 is maintained in the recess 144.

Referring to FIG. 9, a portion of the remaining passivation layer 142, that is not etched, has a thickness T3, and the recess 144 has a depth D less than the thickness T3. In some embodiments, the depth D is greater than half of the thickness T3. In some embodiments, the conductive pad 114 has a width W3, and the recess 144, over the conductive pad 114, has a width W4 greater than the width W3. After the formation of the recess 144, the first photoresist mask 210, shown in FIG. 8, is removed using an ashing process or a strip process, for example.

Figure 10:
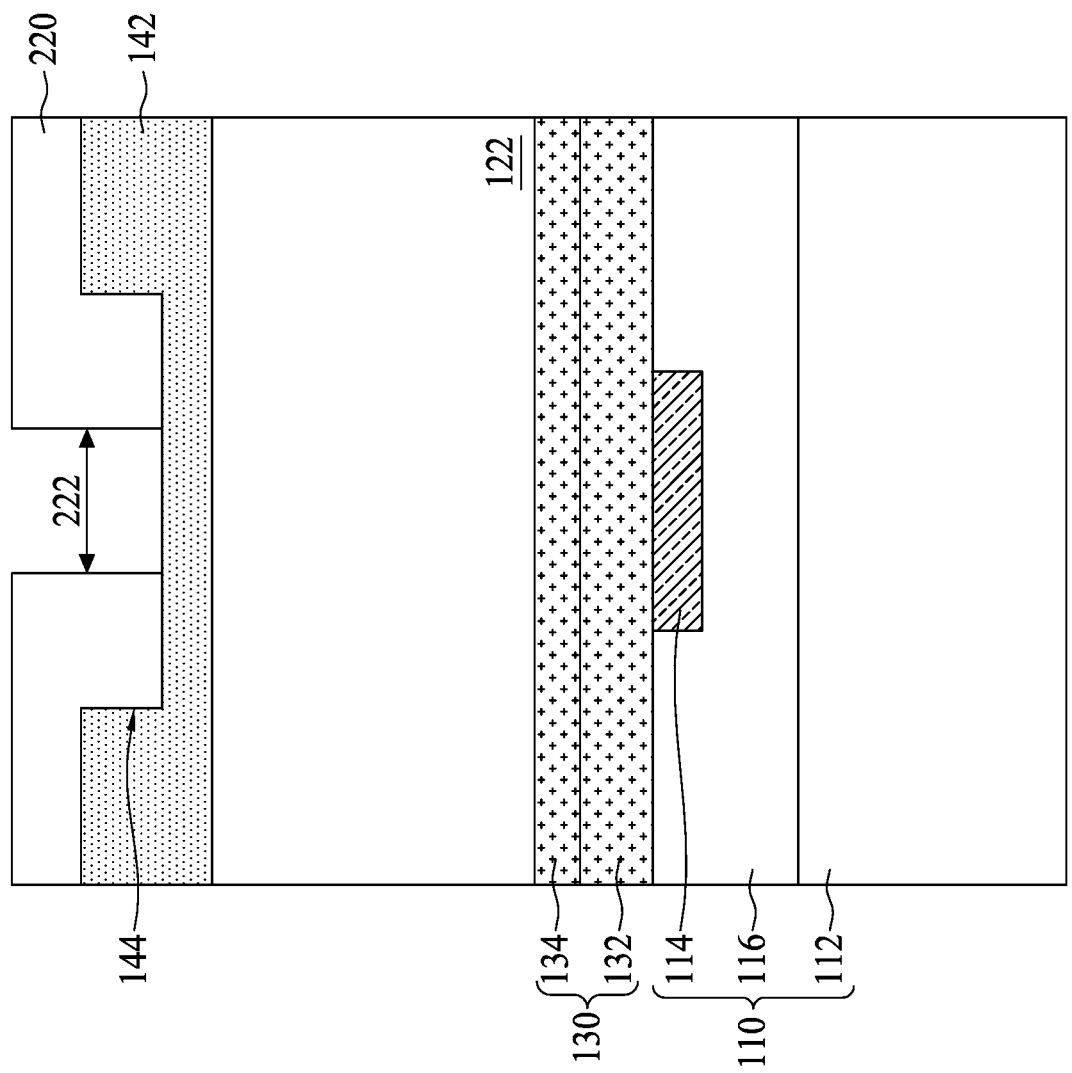

Referring to FIG. 10, a second photoresist mask 220 is provided on the passivation layer 142. The second photoresist mask 220 includes at least one second opening 222 to expose a portion of the passivation layer 142 below the recess 144. The formation of the second photoresist mask 220 includes (1) applying a photosensitive material on the remaining passivation layer 142 and filling in the recess 144 using a spin-coating process, (2) drying the photosensitive material using a soft-baking process, and (3) performing a photolithography process, including exposing and developing processes, to remove a portion of the photosensitive material over the conductive pad 114, thereby forming the opening 222.

Figure 11:
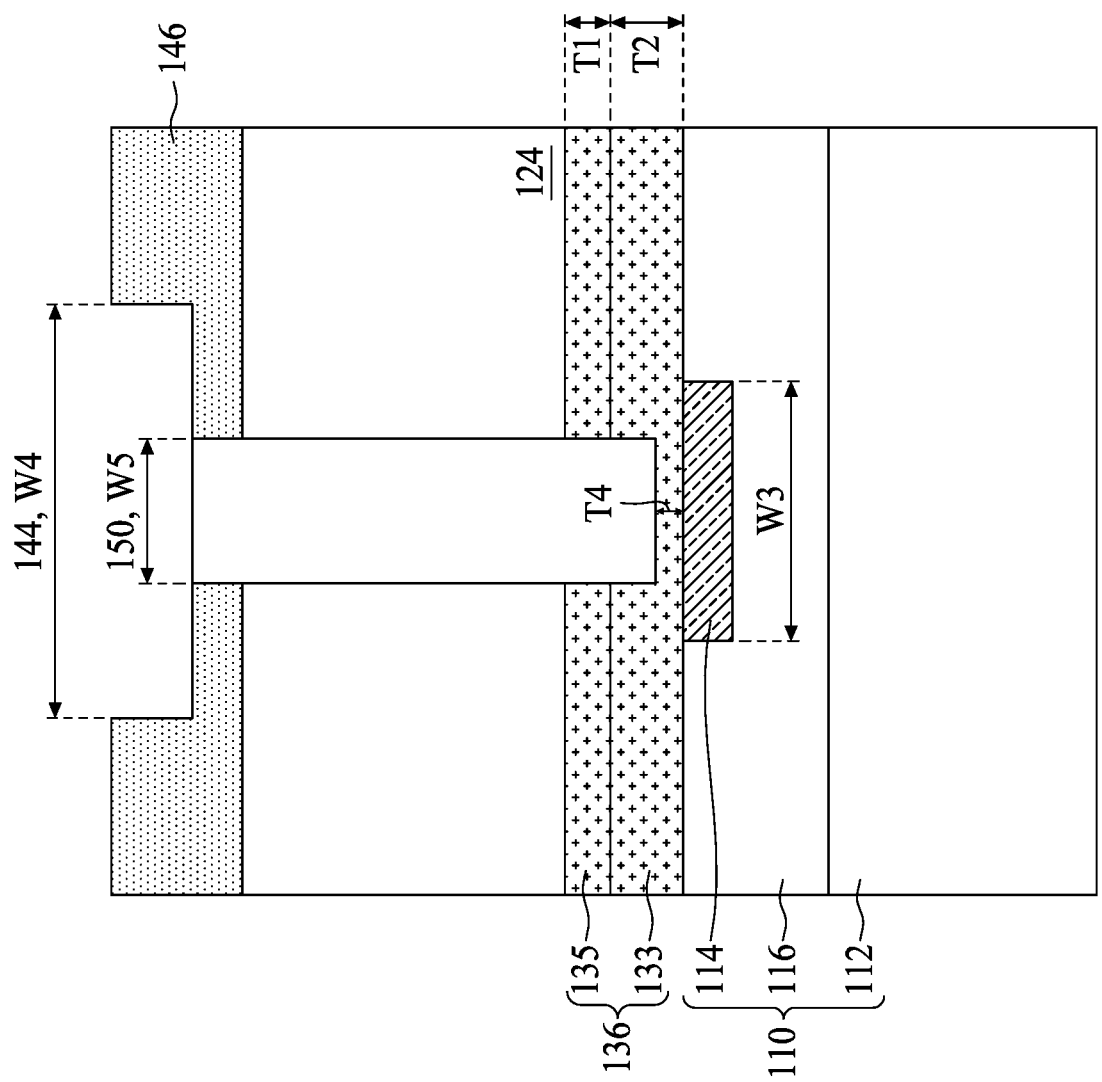

Referring to FIGS. 10 and 11, at least one trench 150 penetrating through the passivation layer 142 and the bulk semiconductor 122 and extending into the dielectric layer 130 is created according to a step S312 in FIG. 2. The passivation layer 142, the bulk semiconductor 122 and the dielectric layer 130 are anisotropically dry-etched, using at least one reactive ion etching (RIE) process, for example, through the opening 222 to form the trench 150, so that the width in the opening 222 is maintained in the trench 150. It should be noted that the etching process may utilize multiple etchants, selected based on the materials of the passivation layer 142, the bulk semiconductor 122 and the dielectric layer 130, to sequentially etch the passivation layer 142, the bulk semiconductor 122 and the dielectric layer 130.

Referring to FIG. 11, the trench 150, communicating with the recess 144, has a width W5, less than the width W3 of the conductive pad 114 and the width W4 of the recess 144. The portion of the dielectric layer 136 remaining below the trench 150 has a thickness T4, which is less than half of a sum of the first thickness T1 and the second thickness T2 of the dielectric films 132 and 134. After the formation of the trench 150, an ashing process or a wet strip process may be used to remove the second photoresist mask 220 shown in FIG. 10, wherein the wet strip process may chemically alter the second photoresist mask 220 so that it no longer adheres to the remaining passivation layer 146.

Figure 12:
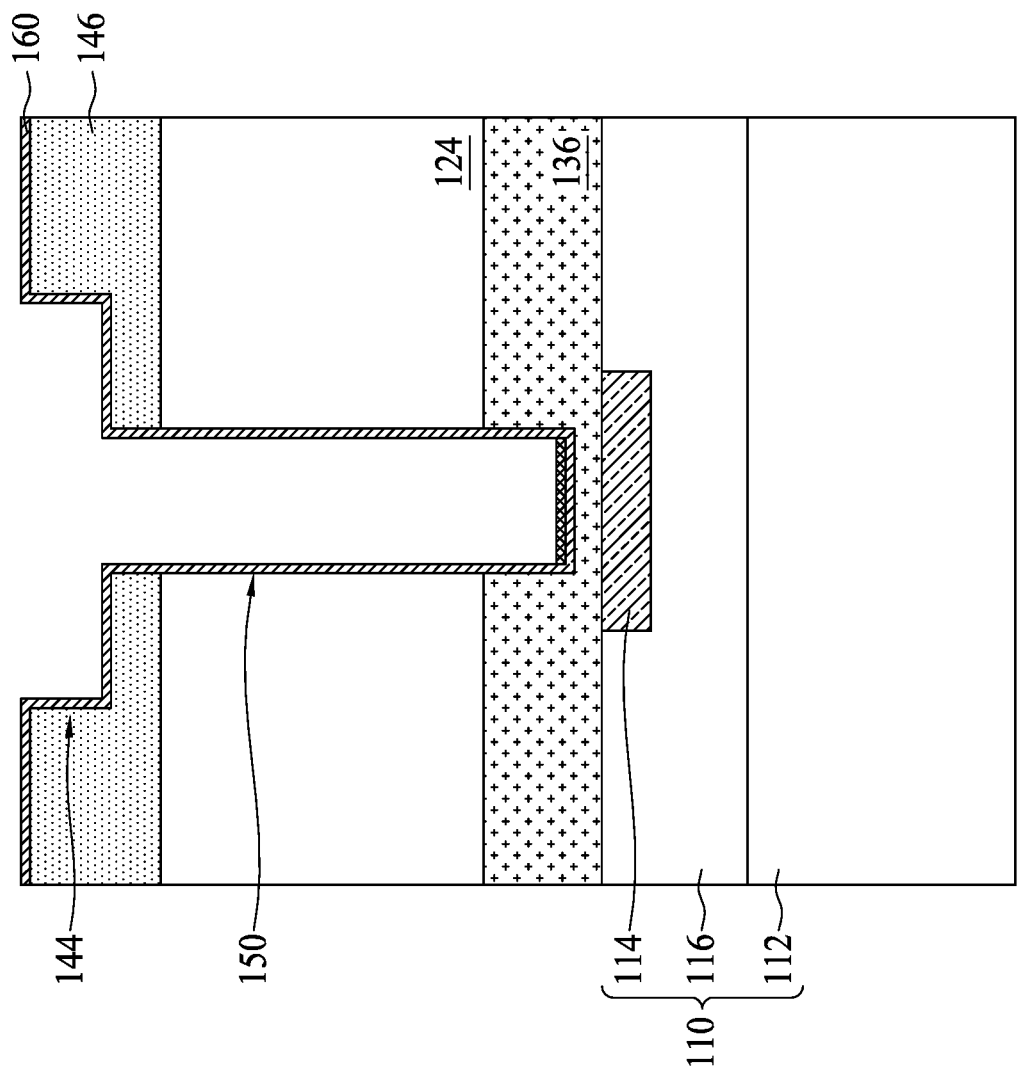

Referring to FIG. 12, an isolation film 160 is deposited in the recess 144 and in the trench 150 according to a step S314 in FIG. 2. The isolation film 160 is formed on portions of the bulk semiconductor 124 where the trench 150 penetrating, the dielectric layer 136 exposed by the recess 144, and the passivation layer 146 exposed by the recess 144, but the isolation film 160 does not completely fill the recess 144 and the trench 150. The isolation film 160, having a substantially uniform thickness, has a topology following the topology of the exposed portions of the bulk semiconductor 124, the dielectric layer 136 and the passivation layer 146. By way of example, the isolation film 160 includes oxide, nitride, oxynitride or high-k material and can be deposited using a CVD process, an ALD process, or the like. In some embodiments, the isolation film 160 and the dielectric layer 136 can have the same material, but the present disclosure is not limited thereto.

Figure 13:
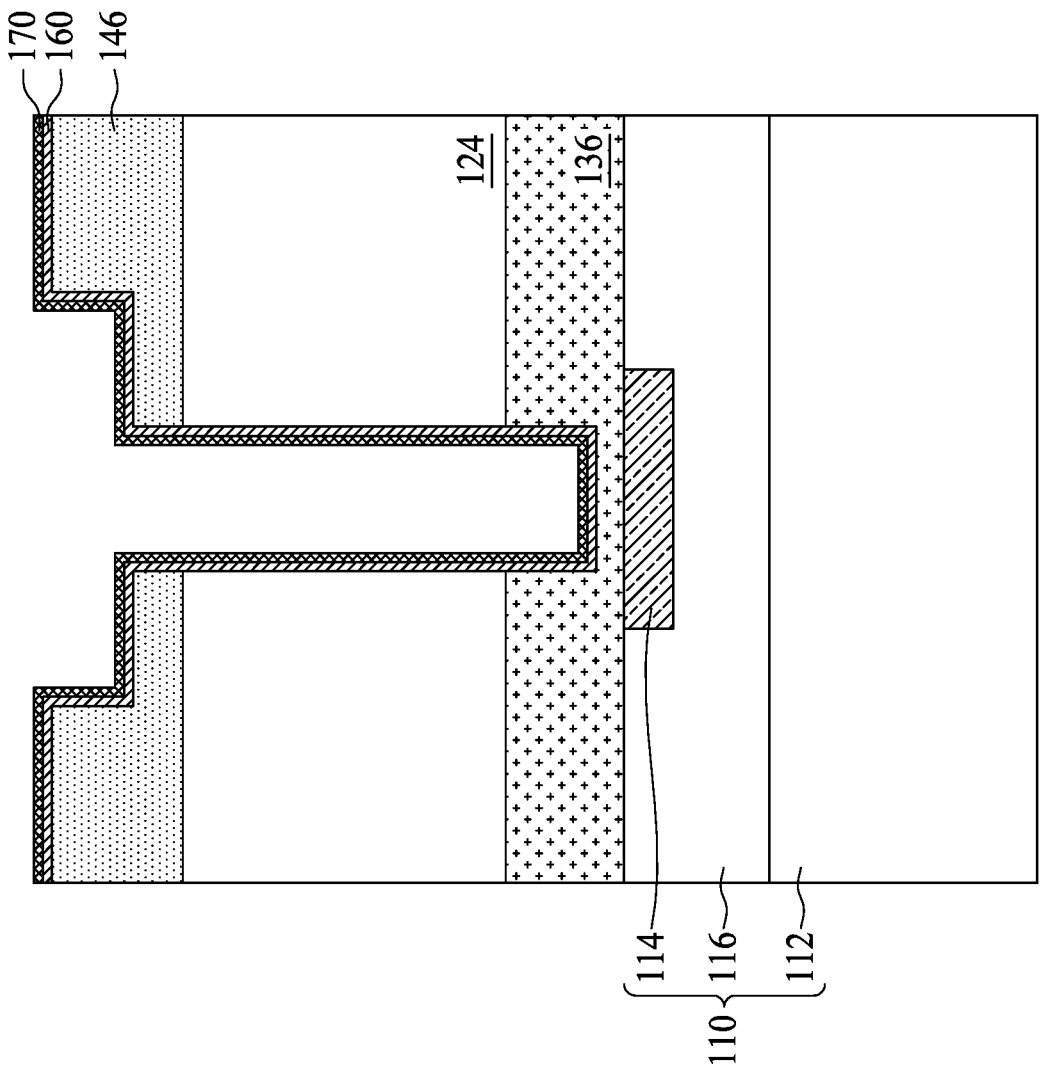

Referring to FIG. 13, a protective film 170 is deposited on the isolation film 160 according to a step S316 in FIG. 2. The protective film 170, having a substantially uniform thickness, covers the isolation film 160, but does not fill the recess 144 and the trench 150. In order to secure the step coverage, protective film 170 can be formed using a PVD process or an ALD process, for example, wherein the protective film 170 deposited using the ALD process is highly uniform in thickness. In some embodiments, the protective film 170 may be a single-layered structure including refractory metals (such as tantalum and titanium), refractory metal nitrides, or refractory metal silicon nitrides. In alternative embodiments, the protective film 170 may comprise a multi-layered structure including one or more refractory metals, refractory metal nitrides, or refractory metal silicon nitrides.

Figure 14:
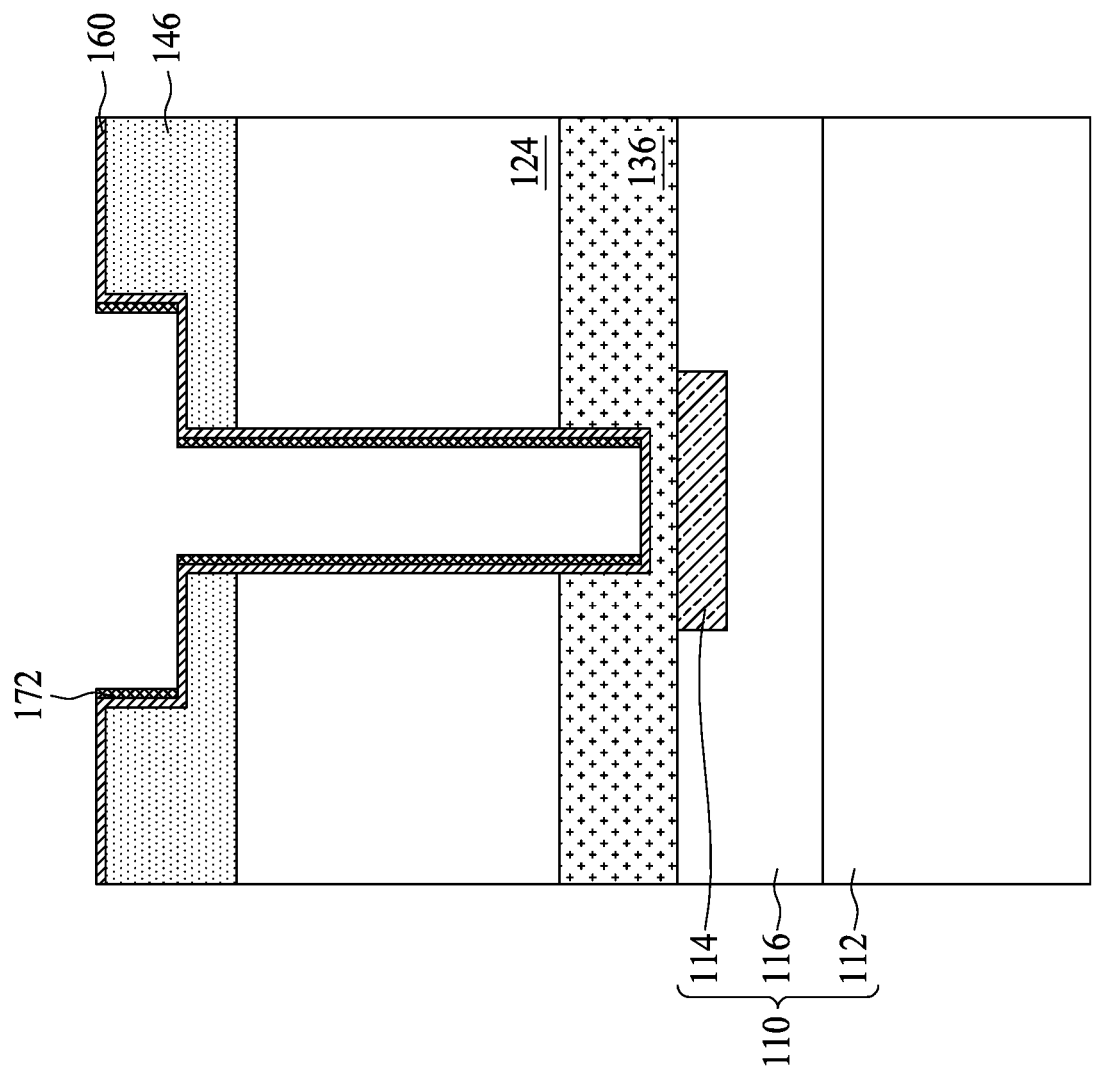
Figure 15:
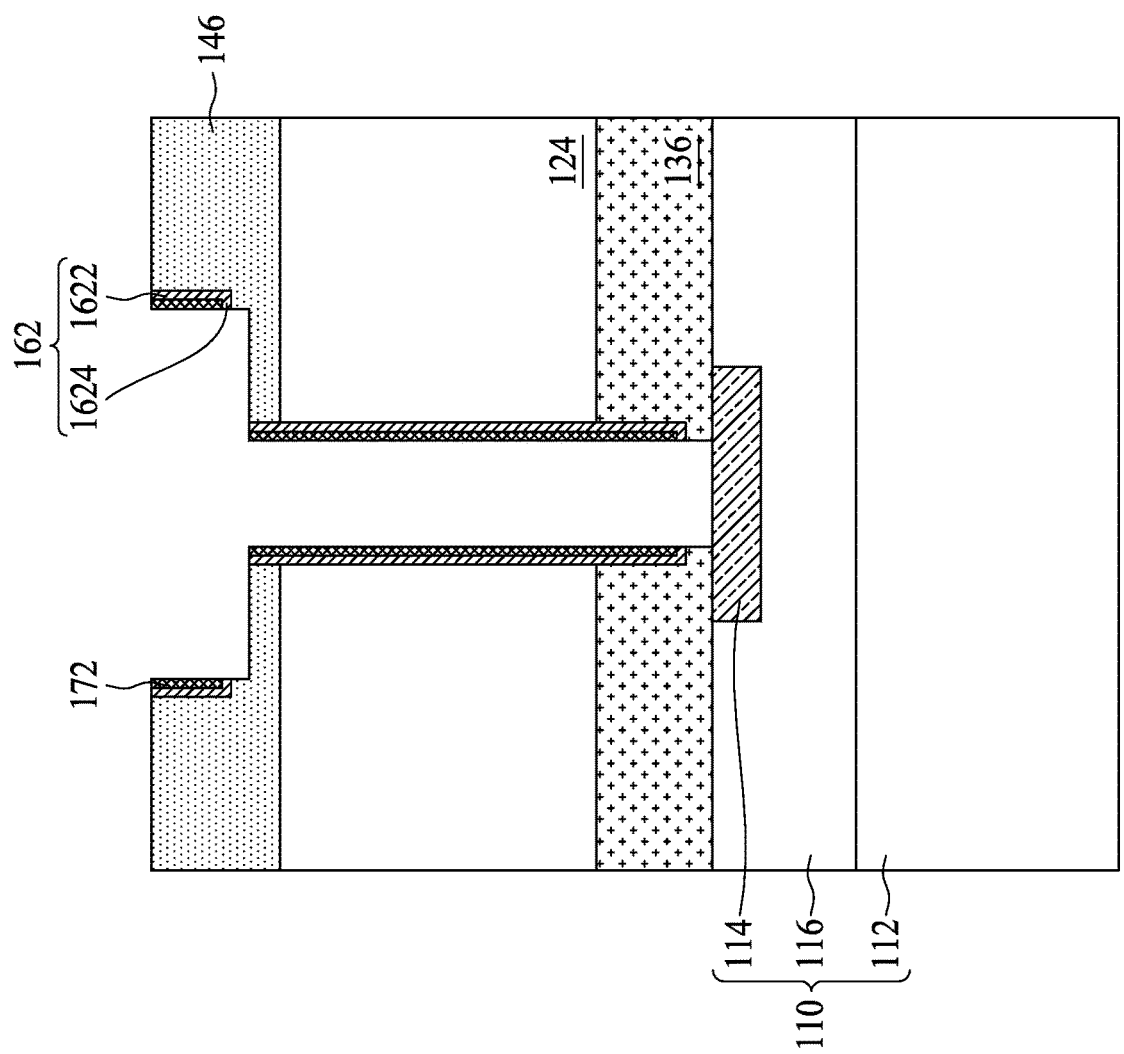

Referring to FIGS. 14 and 15, portions of the protective film 170, the isolation film 160 and the dielectric layer 136 are removed to expose the conductive pad 114 according to a step S318 in FIG. 2. In FIG. 14, horizontal portions of the protective film 170 are removed using an anisotropic etching process, while the vertical portions of the protective film 170 are left on the isolation film 160, thereby forming a plurality of protective liners 172. The chemistry of the anisotropic etching process can be selective to the material of the isolation film 160. In other words, no substantial quantity of the material of the isolation film 160 is removed during the etching of the horizontal portions of the protective film 170.

Referring to FIG. 15, horizontal portions of the isolation film 160 not covered by the protective liners 172 and a portion of the dielectric layer 136 below the trench 150 are removed to expose the conductive pad 114. Therefore, a plurality of isolation liners 162 are formed. As shown in FIG. 15, at least one of isolation liners 162 includes vertical segment 1622 parallel to the protective liners 172 and a plurality of horizontal segment 1624 connecting a lower end of the vertical segment 1622. Referring to FIGS. 14 and 15, in some embodiments, portions of the passivation layer 146 beneath the horizontal portions of the isolation film 160 can be removed simultaneous with the etching of the isolation film 160 if the passivation layer 146 and the isolation film 160 contain the same material. In some embodiments, the protective liners 172 are employed to prevent the vertical segment 1622 of the isolation liner 162 in the recess 142 and the vertical segment 1622 of the isolation liner 162 in the trench 150 and proximal to the recess 142 from removal during an anisotropic etching process.

Figure 16:
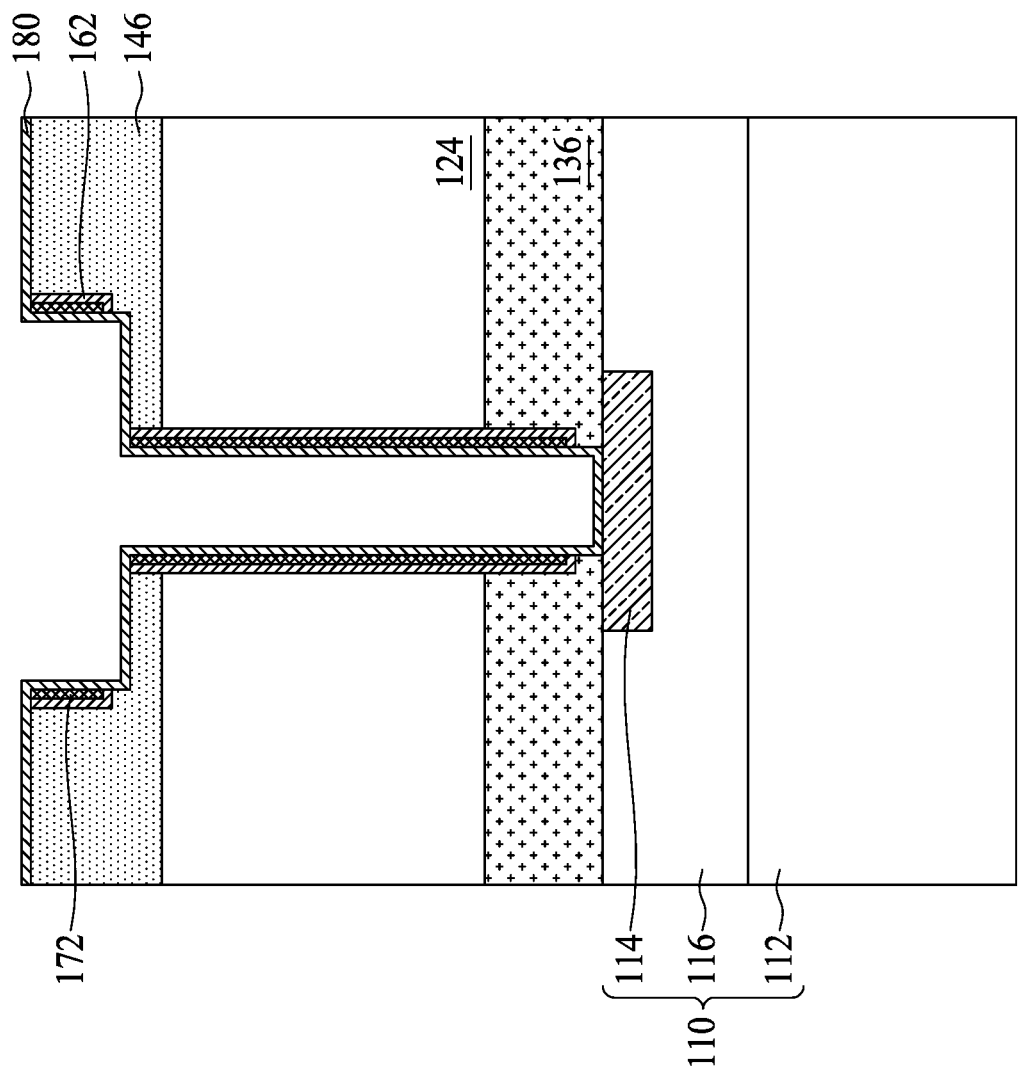

Referring to FIG. 16, a diffusion barrier film 180 is deposited on the exposed portions of the conductive pad 114, the dielectric layer 136, the passivation layer 146, the isolation liners 162, and the protective liners 172 according to a step S320 in FIG. 2. The diffusion barrier film 180, having a substantially uniform thickness, has a topology following the topology of the conductive pad 114, the dielectric layer 136, the passivation layer 146, the isolation liners 162, and the protective liners 172. In order to secure the step coverage, the diffusion barrier film 180 can be formed using a PVD process or an ALD process, for example. The diffusion barrier film 180 may be a single-layered structure or a multi-layered structure including one or more refractory metals, refractory metal nitrides, or refractory metal silicon nitrides. In some embodiments, the protective liners 162 can include the same material to reduce cost.

Figure 17:
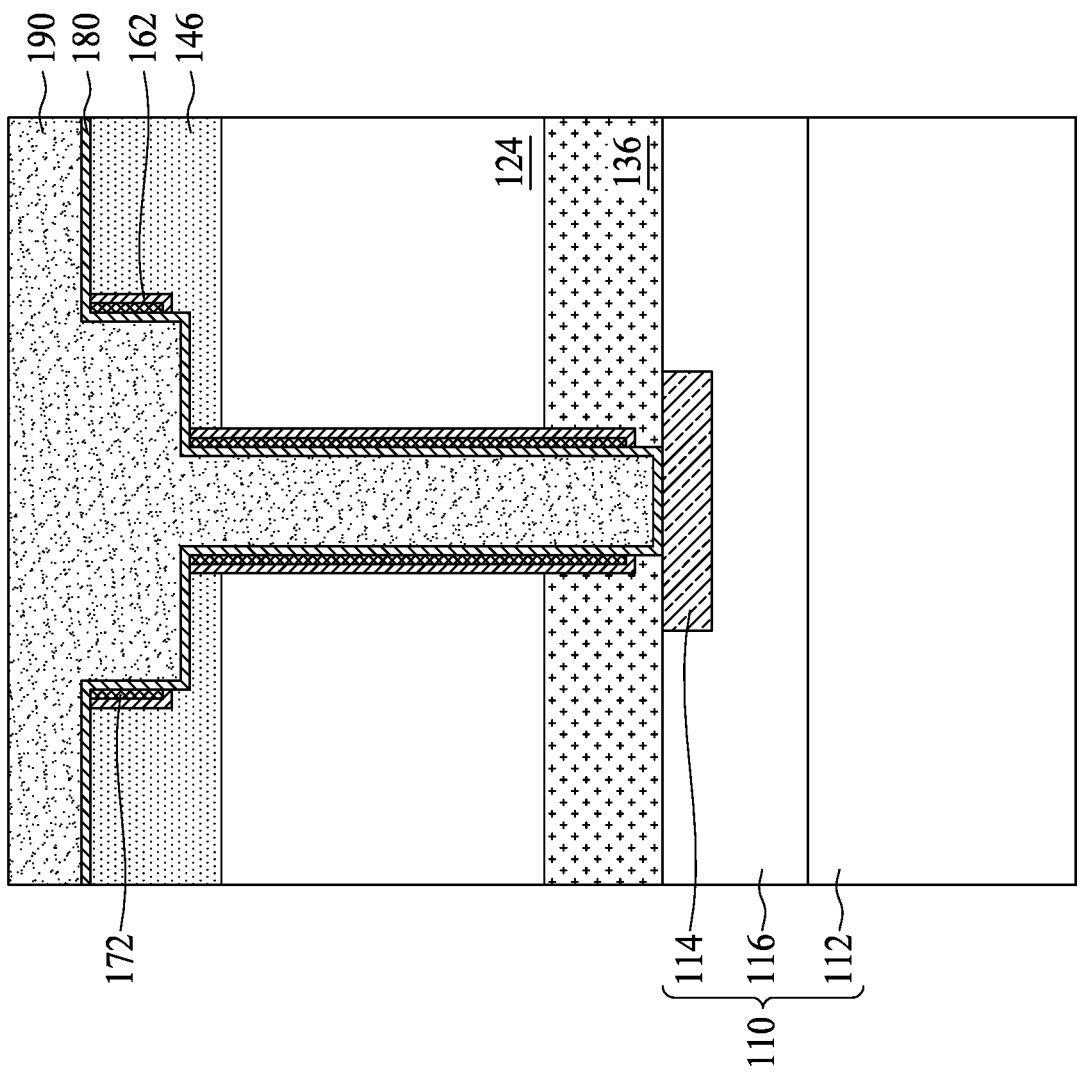

Referring to FIG. 17, a conductive material 190 is deposited to fill the recess 144 and the trench 150 according to a step S322 in FIG. 2. The conductive material 190 is conformally and uniformly deposited on the diffusion barrier film 180 until the recess 144 and the trench 150 are completely filled. The diffusion barrier film 180 is employed to prevent the conductive material from flaking or spalling from the dielectric layer 136, the passivation layer 146 and the isolation liners 162. The conductive material 190 may include metal, such as copper, tungsten, aluminum, silver, gold, indium or the like. The isolation liners 162 are employed to separate the conductive material 190 from the bulk semiconductor 124, thereby preventing the conductive material 190 from diffusion in the bulk semiconductor 124. The conductive material 190 may be deposited using a CVD process, a PVD process, an ALD process, or another suitable process.

Figure 18:
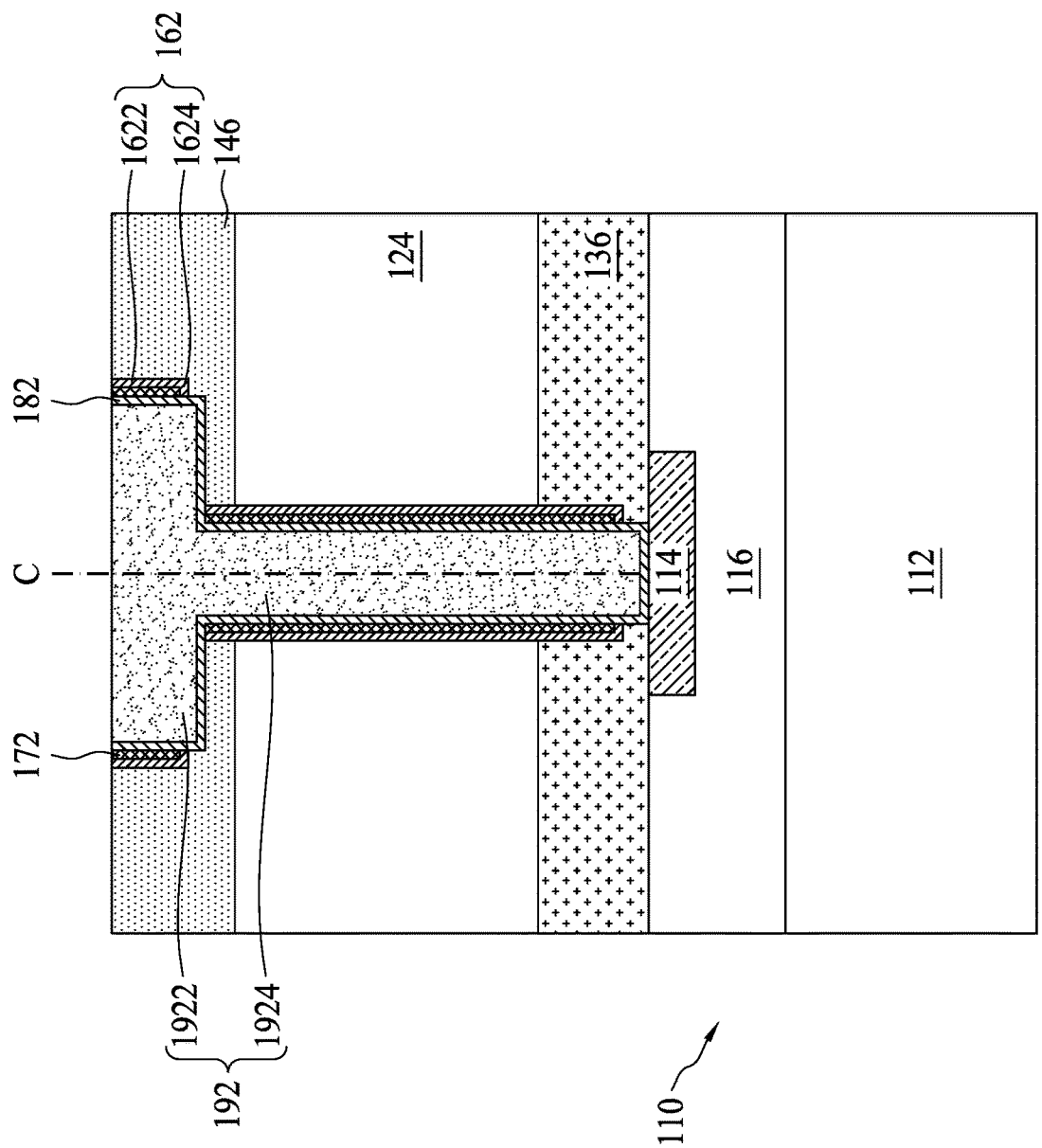

Referring to FIG. 18, a planarizing process is performed to remove the conductive material 190 overflowing the recess 144. Consequently, the passivation layer 146 is exposed and a conductive plug 192 is formed. The conductive plug 192 includes a first block 1922 disposed in the passivation layer 146 and a second block 1924 penetrating through the bulk semiconductor 124 and the dielectric layer 136, wherein the second block 1924 is connected to the first block 1922 in the passivation layer 146. The first block 1922 and the second block 1924 of the conductive plug 192 have different widths. In addition, the first block 1922 and the second block 1924 are symmetric with respect to a central axis C. In some embodiments, the conductive plug 192 can be T-shaped when viewed from a cross-sectional perspective. The planarizing process can include a chemical mechanical polishing (CMP) process and/or a wet etching process. The T-shaped conductive plug 192 can facilitate the bonding of the bump 200, as described below.

Figure 19:
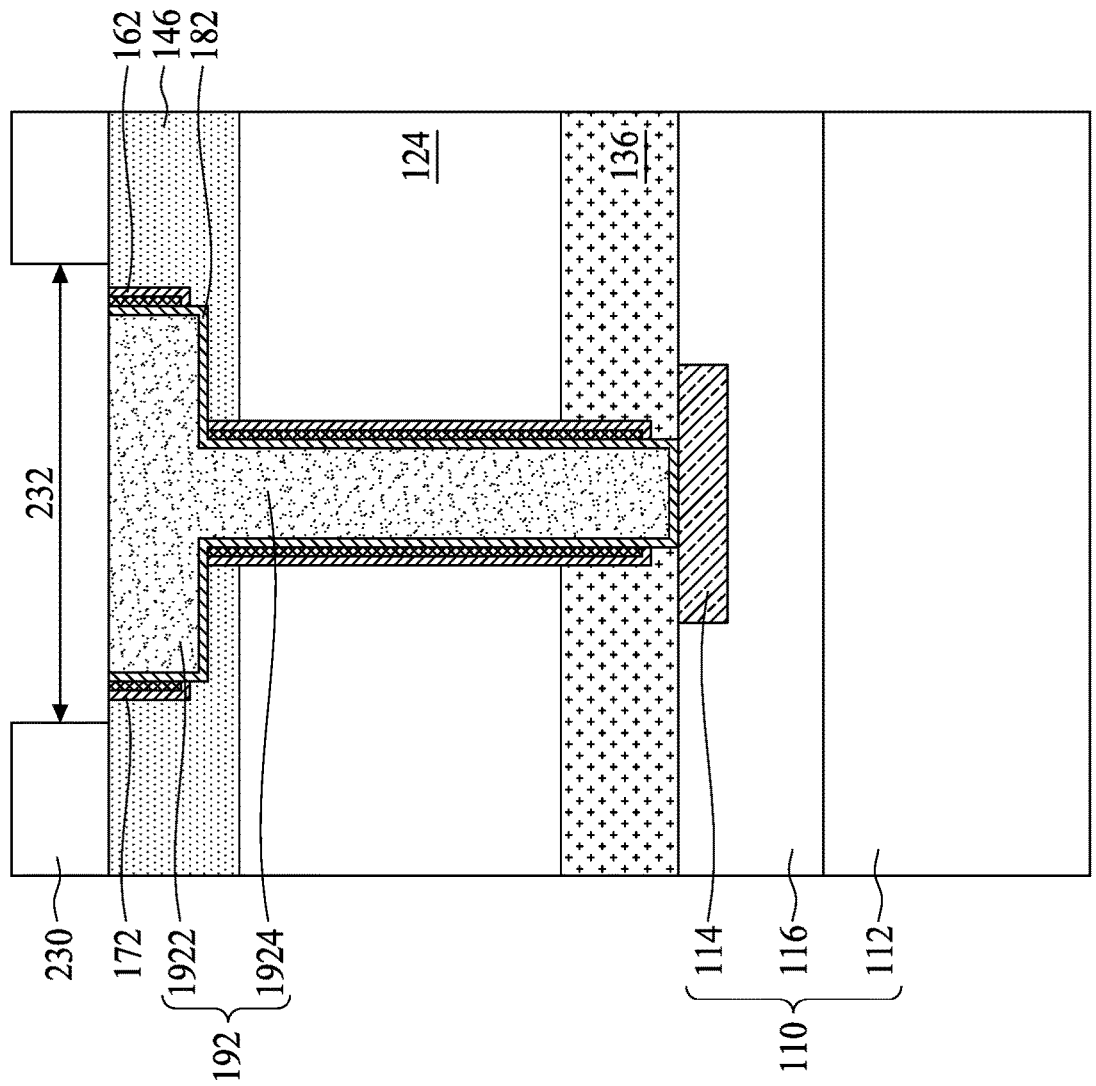

Referring to FIG. 19, a third photoresist mask 230, including at least one opening 232, is applied on the passivation layer 146 to expose the diffusion barrier film 182 and the conductive plug 192. The third photoresist mask 230 can be formed by performing an exposure process and a develop process on a photosensitive material that fully covers the passivation layer 146, the isolation liners 162, the protective liners 172, the diffusion barrier film 182, and the conductive plug 192.

Figure 20:
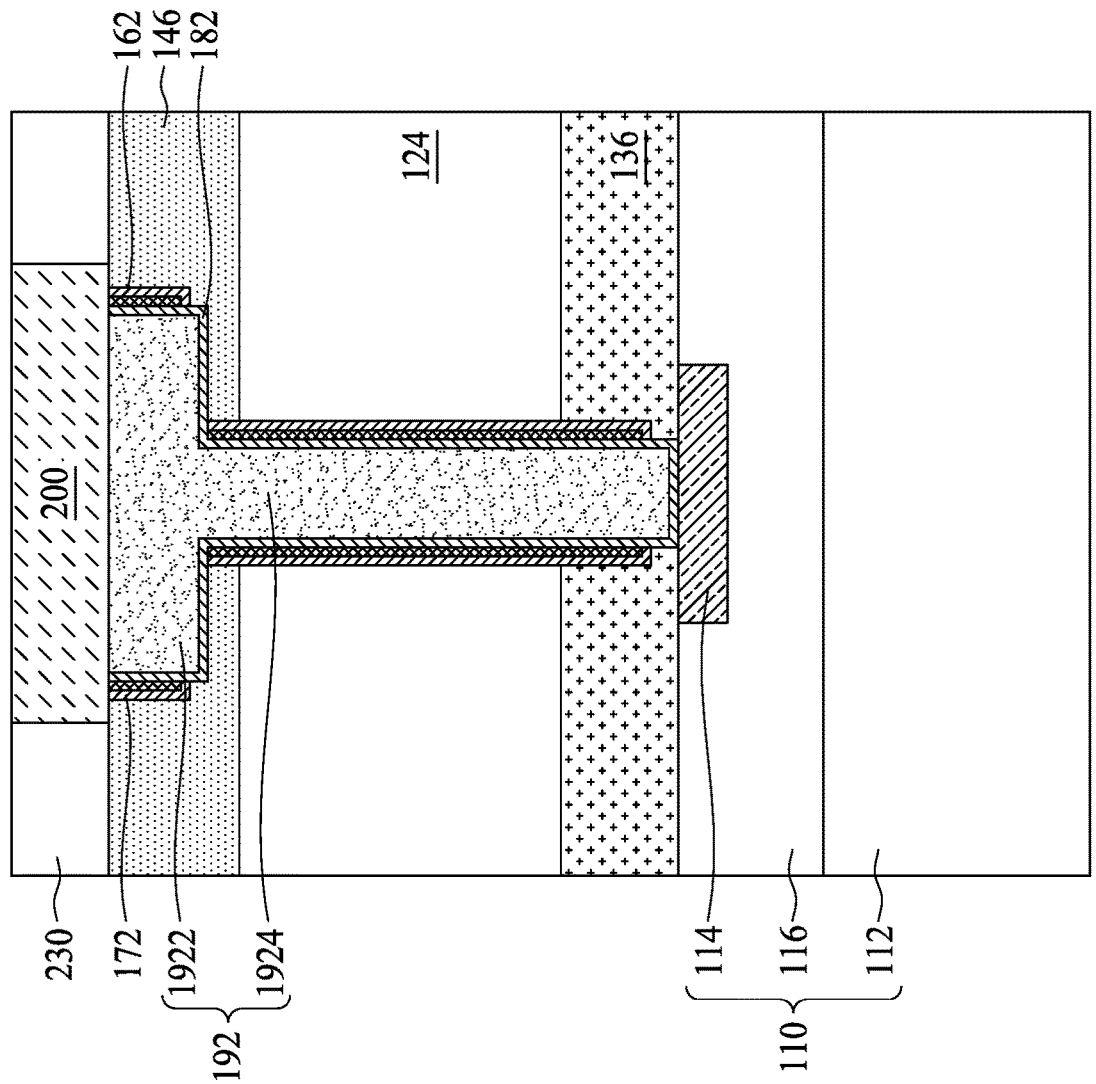

Referring to FIGS. 19 and 20, at least one bump 200 is formed to at least connect the diffusion barrier film 182 and the conductive plug 192. In some embodiments, the bump 200 may further be in contact with the protective liners 172 including refractory metal(s) and a portion of the passivation layer 146 exposed by the opening 232. The bump 200 can be formed by initially placing a solder flux (not shown) on the portions of the passivation layer 146, and the conductive plug 192 exposed by the opening 232, then disposing the bump 200 on the solder flux; once the bump 200 is in contact with the solder flux, a reflow may be performed to reflow the material of the bump 200 and the solder flux to physically bond the bump 200 to the diffusion barrier film 182 and the conductive plug 192.

An ashing process or a wet strip process may be used to remove the third photoresist mask 230, wherein the wet strip process may chemically alter the third photoresist mask 230 so that it no longer adheres to the passivation layer 146. Consequently, the semiconductor assembly 10 shown in FIG. 1 is completely formed.

In conclusion, the configuration of the semiconductor assembly 10 including the T-shaped conductive plug 192 and the protective liners 172 can facilitate the bonding of the bump 22 and prevent metal spike, thereby enhancing reliability of the semiconductor assembly 10.

One aspect of the present disclosure provides a semiconductor assembly. The semiconductor assembly comprises a semiconductor device, a bulk semiconductor, a passivation layer, at least one conductive plug, a plurality of protective liners, and a plurality of isolation liners. The semiconductor device comprises at least one conductive pad. The bulk semiconductor is disposed over the semiconductor device. The passivation layer covers the bulk semiconductor. The conductive plug comprises a first block disposed in the passivation layer and a second block disposed between the first block and the conductive pad. Portions of peripheries of the first and second blocks of the conductive plug are surrounded by the plurality of protective liners. The plurality of isolation liners are disposed over portions of the peripheries of the first and second blocks of the conductive plug.

One aspect of the present disclosure provides a method of manufacturing a semiconductor assembly. The method comprises steps of bonding a bulk semiconductor to a semiconductor device via a dielectric layer; depositing a passivation layer on the bulk semiconductor; creating at least one recess in the passivation layer; creating at least one trench penetrating through the passivation layer and the bulk semiconductor and extending into the dielectric layer, wherein the trench is in communication with the recess; forming a plurality of isolation liners and a plurality of protective liners on inner walls of the bulk semiconductor, the dielectric layer and portions of the passivation layer exposed by the recess and the trench; removing a portion of the dielectric layer below the trench to expose at least one conductive pad of the semiconductor device; and depositing a conductive material in the trench and the recess.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods and steps.

What is claimed is:

1. A method of manufacturing a semiconductor assembly, comprising:
    bonding a bulk semiconductor to a semiconductor device via a dielectric layer;
    depositing a passivation layer on the bulk semiconductor;
    creating at least one recess in the passivation layer;
    creating at least one trench penetrating through the passivation layer and the bulk semiconductor and extending into the dielectric layer, wherein the trench is in communication with the recess;
    forming a plurality of isolation liners and a plurality of protective liners on inner walls of the bulk semiconductor, the dielectric layer and portions of the passivation layer exposed by the recess and the trench;
    removing a portion of the dielectric layer below the trench to expose at least one conductive pad of the semiconductor device; and
    depositing a conductive material in the trench and the recess.

2. The method of claim 1, further comprising depositing a diffusion barrier film on the conductive pad, the isolation liners, the protective liners, and portions of the dielectric layer and the passivation layer exposed through the protective liners prior to the deposition of the conductive material.

3. The method of claim 2, wherein the diffusion barrier film has a topology following a topology of the isolation liners, the protective liners, the portions of the passivation layer exposed by the recess, and the portions of the dielectric layer not covered by the isolation liners and the protective liners.

4. The method of claim 1, wherein the formation of the isolation liners and the protective liners comprises:
    depositing an isolation film on the passivation layer and in the recess and the trench;
    depositing a protective film on the isolation film;
    removing horizontal portions of the protective film to form the protective liners; and
    removing portions of the isolation film not covered by the protective liners.

5. The method of claim 4, wherein portions of the passivation layer not covered by the isolation liners are removed during the removal of the portion of the dielectric layer below the trench.

6. The method of claim 4, wherein the portion of the dielectric layer below the trench is removed during the removal of the portion of the isolation film not covered by the diffusion barrier liners.

7. The method of claim 4, wherein the isolation film has a topology following a topology of the bulk semiconductor, the dielectric layer, and the portions of the passivation layer exposed by the recess and the trench.

8. The method of claim 1, wherein the bonding of the bulk semiconductor and the semiconductor device comprise:
    depositing dielectric films on the semiconductor device and the bulk semiconductor;
    mounting the semiconductor device onto the bulk semiconductor so that the dielectric films are in contact; and
    performing an anneal process to fuse the dielectric films, thereby forming the dielectric layer.

9. The method of claim 1, wherein after the formation of the trench, a thickness of the dielectric layer below the trench is less than half of a thickness of the dielectric layer connecting the bulk semiconductor to the semiconductor device.

10. The method of claim 1, wherein the conductive pad has a first width, the recess has a second width less than the first width, and the trench has a third width less than the first and second widths.

11. The method of claim 1, further comprising performing a grinding process to thin the bulk semiconductor prior to the deposition of the passivation layer.

12. The method of claim 1, further comprising:
  performing a planarizing process to remove a portion of the conductive material overflowing the recess; and
  forming at least one bump on the conductive material after the planarizing process.

\* \* \* \* \*